United States Patent [19]

Seitz

[11] Patent Number: 5,245,509
[45] Date of Patent: Sep. 14, 1993

[54] PRINTED CIRCUIT BOARD ARRANGEMENT WITH SURFACE-MOUNTED CONNECTOR STRIP AND A METHOD FOR MANUFACTURING THE ARRANGEMENT

[75] Inventor: Georg Seitz, Kasing, Fed. Rep. of Germany

[73] Assignee: TELEFUNKEN electronic GmbH, Heilbronn, Fed. Rep. of Germany

[21] Appl. No.: 929,532

[22] Filed: Aug. 14, 1992

[30] Foreign Application Priority Data

Sep. 5, 1991 [DE] Fed. Rep. of Germany ....... 4129514

[51] Int. Cl.$^5$ .................................................. H05K 7/20
[52] U.S. Cl. ........................................ 361/720; 29/840; 29/843; 174/254; 361/728; 361/749; 361/783
[58] Field of Search ................. 174/254; 361/386-389, 361/392, 394-395, 398-399, 400, 405-406, 408, 413; 29/840, 843

[56] References Cited

U.S. PATENT DOCUMENTS

| | | |
|---|---|---|
| 4,413,308 | 11/1983 | Brown .................................. 361/408 |
| 5,057,969 | 10/1991 | Ameen et al. ........................ 361/406 |

FOREIGN PATENT DOCUMENTS

| | | |
|---|---|---|
| 0044247 | 1/1982 | European Pat. Off. . |
| 0147039 | 7/1985 | European Pat. Off. . |
| WO89/09534 | 10/1989 | PCT Int'l Appl. . |

*Primary Examiner*—Gregory D. Thompson
*Attorney, Agent, or Firm*—Spencer, Frank & Schneider

[57] ABSTRACT

The invention relates to a printed circuit board disposed on a film serving as the carrier material. A connector strip having a large number of connection pins is disposed on the printed circuit board using surface-mounting technology. Connector strips of this type are widespread in digital technology. In the case of circuits in the fields of power electronics or motor vehicle electronics, connector strips cannot be surface-mounted because of the larger cross-sections of the connections. In a printed circuit board of the type mentioned at the outset, recesses are provided in the film stiffener underneath the solder points, such that when the connection pins of the connector strip are soldered, level differences in the connection pins are compensated by the deformation of the carrier film. With this measure, tensions are compensated for the most part by the deformation of the carrier film, so that connector strips for power electronics and motor vehicle electronics applications can also be surface-mounted.

9 Claims, 1 Drawing Sheet

PRINTED CIRCUIT BOARD ARRANGEMENT WITH SURFACE-MOUNTED CONNECTOR STRIP AND A METHOD FOR MANUFACTURING THE ARRANGEMENT

BACKGROUND OF THE INVENTION

The invention relates to a printed circuit board arranged having a printed circuit on a carrier film serving as the carrier material. A connector strip having a large number of connection pins is disposed on the printed circuit board using surface-mounting technology.

In digital technology, connector strips surface-mounted on the printed circuit board are widespread. The connector strips comprise a plastic body containing the connector part and from which a row of connection pins project from one longitudinal side. The connector strip is connected to the printed circuit board by, for example, rivets or adhesives. The connection pins are in contact with the solder connection points provided on the printed circuit board. The solder connection points generally comprise a solder paste applied to the printed circuit board by screen printing. The firm solder connection is achieved by heating. The solder paste melts and flows around the corresponding connection pins of the connector strip. To ensure that all connection pins are in contact with the solder connection point during the soldering operation in the case of a larger connector strip with a large number of connections, the connector strip must be pressed onto the printed circuit board during heating. After cooling of the solder connection, therefore, tensions are generated between the printed circuit board and the connector strip as a result of deformation of the connection pins during pressing. The magnitude of these tensions depends on the contact pressure during soldering, on the spacing of the connection pin before soldering, and on the cross-section of the connection pin. This surface-mounted connector strip technique is however, only usable, for connectors, through which not very high currents flow and correspondingly, in which the cross-section of the connection pins is small.

In the case of circuits in the fields of power electronics or motor vehicle electronics, which require higher currents, the method described above cannot be used in series production. The reason for this is the larger cross-sections of the various connection pins. The larger cross-sections of the connection pins require a higher contact pressure during soldering of the connector for all the connection pins to be in adequate contact with the corresponding solder points during the soldering process. After cooling of the solder connection, increased tensions are generated between the connection pins and the printed circuit board on account of the large cross-sections of the connection pins. These tensions result in possible deformation of the connection pins in the plastic body or in the conductors lifting off the carrier film. In addition, deformations of the connector contacts in the plastic housing can already occur during the soldering process. For this reason, the connector strips, which must meet high current requirements, are connected to the printed circuit board by a second soldering process of the fit-through type in the case of printed circuit boards of which the electrical components are surface-mounted.

A first object underlying the invention is therefore to provide a printed circuit board having a surface-mounted connector strip that is also suitable for higher currents.

A further object of the invention is to provide a method by which a connector strip can be surface-mounted on a printed circuit board.

SUMMARY OF THE INVENTION

The first object is attained by a printed circuit board having a printed circuit disposed on a carrier film which is fastened to a film stiffener. The film stiffener has at least one recess located underneath solder connection points on the carrier film for the connection strips of a connector strip fastened to the circuit board. These connection pins have respective free ends which are parallel to the carrier film and which are used to surface mount and electrically connect the connection pins of the connector strip to the printed circuit board at the solder connection points. The existence of the recess or recesses under the portions of the carrier film containing the connection points for the connection pins allows for deformation of the carrier film to compensate for level differences in the connection pins.

The further object is attained by a method for manufacturing the printed circuit board arrangement according to the invention described above which includes the steps of mechanically fastening the connector strip to the printed circuit board such that the free ends of the connection pins lie against the solder connection points above the recesses in the film stiffener, mounting further components on the printed circuit board, and then soldering the further components and the connection pins to the printed circuit board by heating at the solder connection points.

The invention is notable in that the tensions resulting from pressing the connector strip onto the printed circuit board are largely cancelled out by the deformation of the carrier film in the area of the recess. At the same time, level differences in the connection pins are balanced out, so that the contact pressure exerted on the connector strip during soldering can be reduced. It has proved particularly advantageous for the temperature during the soldering process to be selected such that the deformations in the carrier film caused by the connection pins become plastic.

As a result, tensions between the printed circuit board and the connector strip are completely avoided in the vicinity of the connection pins.

DETAILED DESCRIPTION OF THE PREFERRED EMBODIMENTS

Figure 1:
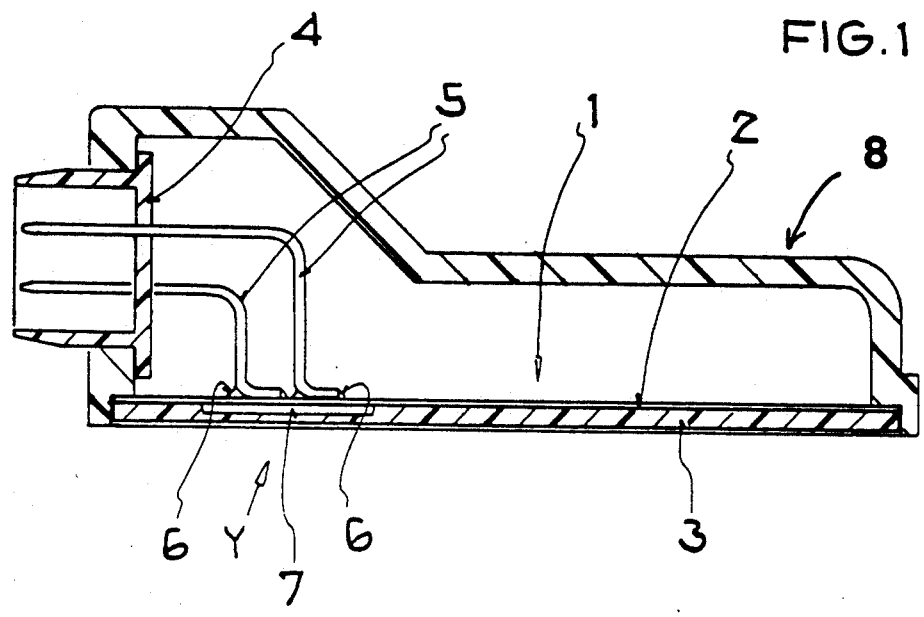
FIG. 1 shows a section through a printed circuit board in accordance with the invention.

The invention is described in the following on the basis of an embodiment. FIG. 1 shows a section through an electronic assembly containing a printed circuit board 1 in accordance with the invention. The printed circuit board 1 comprises a carrier film 2 onto which conductors are deposited using conventional processes. An insulating layer is provided on the conductors to cover these conductors while only exposing them at those points at which electrical components have to contact the conductors. The carrier film 2 is laminated onto a film stiffener 3 that gives the requisite mechanical stability to the printed circuit board 1. The film stiffener 3 is advantageously designed as part of the housing 8 of the electronic assembly in the embodiment. In a further advantageous embodiment of the invention, the film stiffener 3 is made from a thermally conductive material e.g., aluminum. In this case, the film stiffener 3 assumes in addition the function of a heat sink for the electronic assembly. The components of the electronic assembly are connected up on the carrier film 2 using surface-mounting techniques to form a single function group. These components have been omitted from FIG. 1 for greater clarity.

A surface-mounting technique has also been used to position a connector strip 4 on one side of the printed circuit board 1. The connector strip 4 is advantageously mechanically connected to the film stiffener 3, for example using rivets or screws.

As shown, the connector strip 4 can also be connected to the film stiffener 3 by mounting both the strip 4 and the stiffener 3 in a housing 8 which mechanically attaches or couples them together. In addition, the connector strip has on the side facing the printed circuit board 1 a large number of connection pins 5 that are parallel to the carrier film 2 at their free ends and rest on this film. At the contact points, the conductors of the carrier film are free of the insulating layer and are provided with solder. Furthermore, a recess 7 is provided in the film stiffener 3 in the area of the contact points of the connection pins 5 to the carrier film 2. This recess 7 is arranged such that the connection pins 5 press the carrier film 2 a little way into the recess 7. The differing deformation of the carrier film 2 permits compensation of the level differences of the various connection pins 5 to the extent that no tensions and deformations occur in the connector contacts and connection pins 5, and yet sufficient contact is obtained between the connection pins 5 and the carrier film 2.

Figure 2:
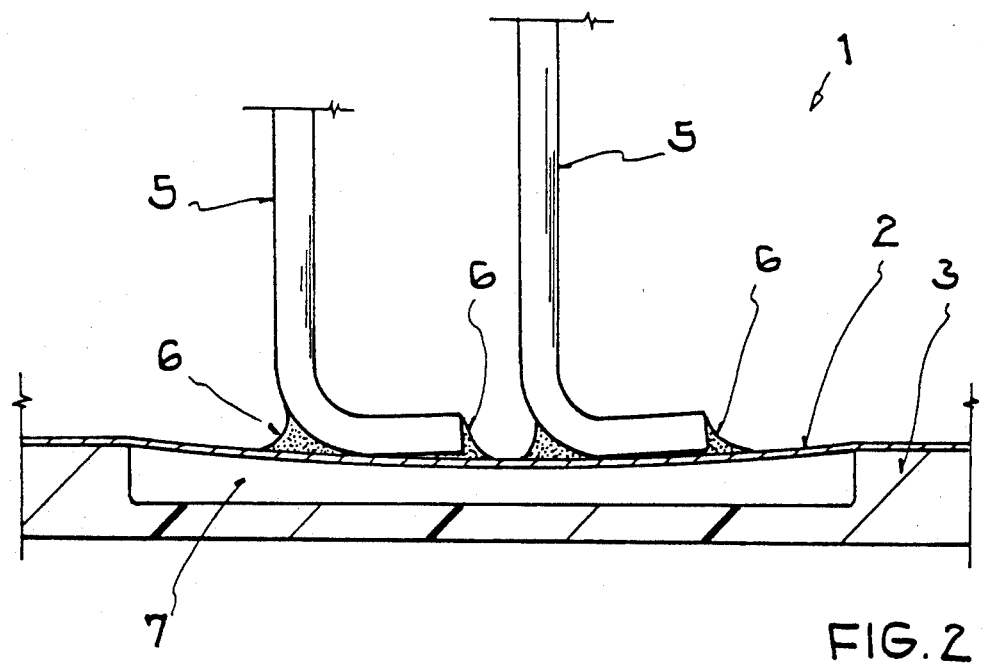
FIG. 2 shows a detail of FIG. 1.

FIG. 2 shows the detail detailed area "y" of FIG. 1. The connectionpins 5 of the connector strip deform the carrier film 2 in the area of the recess 7 such that the carrier film 2 is in good contact with the connection pins 5 via the solder points connection 6. The deformation of the carrier film 2 cancels out any tensions and deformations of the contact or connection pins in the connector strip 4. In an advantageous embodiment of the invention, the deformation of the carrier film 2 is plasticized by heat treatment. This ensures a high durability of the solder connections at connections points 6 between the connection pins 5 of the connector strip 4 and the conductors on the carrier film 2. To manufacture a printed circuit board 1 having a surface-mounted connector strip 4, conductors are first deposited on a carrier film 2 using conventional processes and then provided with an insulating layer. The contact or connection points onto which components are to be soldered later are provided with solder. The carrier film 2 is then laminated onto the film stiffener 3, which has been provided beforehand with a recess 7. The recess 7 is here arranged such that the contact or connection points for the connector strip connection pins 5 lie over the recess 7. Solder paste is then deposited, for example by screen printing, onto the contact points of the carrier film 2, and the components are pre-assembled. The connector strip 4 is in addition mechanically connected to the film stiffener 3 by riveting or screwing. The connection pins 5 of the connector strip 4 now press against the corresponding solder paste spots on the carrier film 2 above the recess 7. The carrier film 2 can yield to the pressure of the various connection pins 5 in the area of the recess 7 and hence compensate for level differences between the various connection pins 5 resulting from differing deformation of the carrier film 2. The array is then heated in a temperature stage so that the solder paste melts and provides a durable electrical connection between the components and the conductors. Conventional processes for surface-mounting technology such as the reflow method are applied here. The temperature during the heating process must be selected in an advantageous embodiment of the process in accordance with the invention such that the carrier film remains plastically deformed. Deformations and tensions in the connector strip can be avoided as a result.

The invention permits even connector strips with large connection pin cross-sections to be reliably connected to a printed circuit board using surface-mounting technology. A further advantage of the invention is that the connector strip 4 can be soldered to the printed circuit board 1 together with the other components in a single soldering process whenever the type of electronic assembly requires large cross-sections in the connection pins 5 of the connector strip 4.

What is claimed is:

1. A printed circuit board arrangement comprising:
 a printed circuit board having a printed circuit disposed on a carrier film, with said carrier film being fastened to a film stiffener;
 a connector strip attached to said printed circuit board, said connector strip having a plurality of connection pins, with each of said connection pins having a free end which is for surface mounting in which the ends of said connection pins parallel to said carrier film and is surface mounted on said printed circuit board and electrically connected via solder connection points to said printed circuit;
 a recess disposed in said film stiffener underneath said solder connection points for said connection pins such that when said connection pins are soldered to said solder connection points, level differences in said connection pins are compensated for by deformation of said carrier film.

2. A printed circuit board arrangement according to claim 1, wherein a single recess in said film stiffener is provided for all of said connection pins.

3. A printed circuit board arrangement according to claim 1, wherein deformation of said carrier film above said recess is plastic.

4. A printed circuit board arrangement according to claim 3, wherein aid film stiffener forms a part of a housing enclosing said printed circuit board.

5. A printed circuit board arrangement according to claim 4, wherein said film stiffener consists of a thermally conductive material and serves as a heat sink.

6. A printed circuit board arrangement according to claim 5, wherein said film stiffener consists of aluminum.

7. A printed circuit board arrangement according to claim 2, wherein deformation of said carrier film above said recess is plastic.

8. A method for manufacture of a printed circuit board arrangement including a printed circuit board having a printed circuit disposed on a carrier film which is fastened to a film stiffener, and a connector strip attached to the printed circuit board and having a plurality of connection pins, each with a free end which is parallel to the carrier film and which is surface mounted on the printed circuit board and electrically connected via solder connection points to the printed circuit, said method comprising the steps of:

providing said film stiffener of said printed circuit board with a recess disposed underneath each of said solder connection points for said connection pins;

mechanically fastening said connector strip to said printed circuit board, with said free ends of said connection pins lying against the provided solder connection points for said connection pins disposed above said recess in said film stiffener;

mounting further component on said printed circuit board; and forming solder connections between said connection pins and said solder connection points by heating.

9. A method according to claim 8, wherein the temperature during said step of forming solder connections is such that deformation of said carrier film above said recess is plastic.

* * * * *